US009831321B2

(12) United States Patent
Chang et al.

(10) Patent No.: US 9,831,321 B2
(45) Date of Patent: *Nov. 28, 2017

(54) SEMICONDUCTOR DEVICE WITH STRAINED LAYER

(71) Applicant: Taiwan Semiconductor Manufacturing Company, Ltd., Hsin-Chu (TW)

(72) Inventors: Lun-Wei Chang, Hsin-Chu (TW); Yun-Ju Sun, Taipei (TW); Tomonari Yamamoto, Jyubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/181,185

(22) Filed: Jun. 13, 2016

(65) Prior Publication Data

US 2016/0293735 A1   Oct. 6, 2016

Related U.S. Application Data

(63) Continuation of application No. 14/097,058, filed on Dec. 4, 2013, now Pat. No. 9,368,626.

(51) Int. Cl.
*H01L 21/8234* (2006.01)
*H01L 21/02* (2006.01)
*H01L 29/66* (2006.01)
*H01L 29/78* (2006.01)
*H01L 21/762* (2006.01)

(52) U.S. Cl.
CPC .. *H01L 29/66795* (2013.01); *H01L 21/02164* (2013.01); *H01L 21/02274* (2013.01); *H01L 21/76224* (2013.01); *H01L 29/66545* (2013.01); *H01L 29/785* (2013.01); *H01L 29/7843* (2013.01); *H01L 29/7853* (2013.01)

(58) Field of Classification Search
CPC ......... H01L 29/66795; H01L 29/66545; H01L 21/02274; H01L 21/02164; H01L 29/785; H01L 29/7843; H01L 29/7853; H01L 21/76224; H01L 21/823431; H01L 21/823821; H01L 21/845; H01L 27/0886
See application file for complete search history.

(56) References Cited

U.S. PATENT DOCUMENTS

| | | | |
|---|---|---|---|
| 7,816,766 B2 | 10/2010 | Tamura et al. | |
| 7,902,005 B2 | 3/2011 | Stapelmann et al. | |
| 8,592,891 B1 | 11/2013 | Polishchuk et al. | |

(Continued)

FOREIGN PATENT DOCUMENTS

| | | |
|---|---|---|
| CN | 1925118 A | 3/2007 |
| CN | 100459160 C | 2/2009 |

(Continued)

*Primary Examiner* — Bitew Dinke
(74) *Attorney, Agent, or Firm* — Slater Matsil, LLP

(57) ABSTRACT

A semiconductor device and method of fabricating thereof is described that includes a substrate including at least one fin, at least one gate stack formed on a top surface of the at least one fin, a first inter-layer dielectric (ILD) layer formed on the top surface of the at least one fin, and a strained layer formed at least on a top surface of the at least one gate stack, wherein the strained layer is configured to provide a strain force to the at least one gate stack.

20 Claims, 9 Drawing Sheets

(56) References Cited

U.S. PATENT DOCUMENTS

| | | | |
|---|---|---|---|
| 8,765,546 B1 | 7/2014 | Hung et al. | |
| 9,368,626 B2* | 6/2016 | Chang | H01L 29/7843 |
| 2001/0050396 A1 | 12/2001 | Esaki | |
| 2002/0187657 A1 | 12/2002 | Morozumi | |
| 2003/0181005 A1* | 9/2003 | Hachimine | H01L 21/823807 |
| | | | 438/231 |
| 2004/0108558 A1 | 6/2004 | Kwak et al. | |
| 2005/0093076 A1 | 5/2005 | Steegen et al. | |
| 2005/0258515 A1 | 11/2005 | Chidambarrao et al. | |
| 2006/0094194 A1 | 5/2006 | Chen et al. | |
| 2006/0284255 A1 | 12/2006 | Shin et al. | |
| 2007/0221956 A1 | 9/2007 | Inaba | |
| 2007/0296027 A1* | 12/2007 | Yang | H01L 21/823807 |
| | | | 257/327 |
| 2008/0048271 A1* | 2/2008 | Yang | H01L 21/823807 |
| | | | 257/369 |
| 2008/0303068 A1 | 12/2008 | Grill et al. | |
| 2008/0305621 A1* | 12/2008 | Dyer | H01L 21/28026 |
| | | | 438/585 |
| 2009/0026505 A1 | 1/2009 | Okano | |
| 2009/0096002 A1 | 4/2009 | Yu et al. | |
| 2009/0101982 A1 | 4/2009 | Nagatomo | |
| 2009/0114955 A1* | 5/2009 | Stapelmann | H01L 29/045 |
| | | | 257/255 |
| 2009/0170319 A1 | 7/2009 | Richter et al. | |
| 2009/0242986 A1* | 10/2009 | Nakabayashi | H01L 29/785 |
| | | | 257/347 |
| 2009/0294807 A1* | 12/2009 | Yan | H01L 21/823807 |
| | | | 257/288 |
| 2010/0025767 A1 | 2/2010 | Inaba | |
| 2010/0163847 A1* | 7/2010 | Majhi | H01L 21/28518 |
| | | | 257/24 |
| 2010/0171180 A1* | 7/2010 | Zhang | H01L 21/823807 |
| | | | 257/369 |
| 2012/0009744 A1* | 1/2012 | Inaba | H01L 21/823807 |
| | | | 438/197 |
| 2012/0161238 A1 | 6/2012 | Scheiper et al. | |
| 2013/0065371 A1 | 3/2013 | Wei et al. | |
| 2013/0175621 A1 | 7/2013 | Chen et al. | |
| 2013/0193526 A1 | 8/2013 | Lo et al. | |
| 2013/0237026 A1 | 9/2013 | Lee et al. | |
| 2013/0277746 A1 | 10/2013 | Baldauf et al. | |
| 2014/0131812 A1 | 5/2014 | Wu et al. | |
| 2014/0167161 A1* | 6/2014 | Tan | H01L 29/7841 |
| | | | 257/347 |
| 2014/0183632 A1 | 7/2014 | Tseng et al. | |
| 2014/0252479 A1 | 9/2014 | Utomo et al. | |
| 2014/0264632 A1 | 9/2014 | Richter et al. | |
| 2014/0284671 A1 | 9/2014 | Hung et al. | |
| 2014/0319462 A1 | 10/2014 | Huang et al. | |
| 2014/0327080 A1 | 11/2014 | Huang et al. | |
| 2015/0008524 A1 | 1/2015 | Hung et al. | |
| 2015/0076609 A1 | 3/2015 | Xie et al. | |
| 2015/0091100 A1 | 4/2015 | Xie et al. | |
| 2016/0020300 A1* | 1/2016 | Tsai | H01L 29/66636 |
| | | | 438/299 |

FOREIGN PATENT DOCUMENTS

| | | | |
|---|---|---|---|
| JP | 2008186989 A | * | 8/2008 |
| JP | 201040630 A | | 2/2010 |

* cited by examiner

SEMICONDUCTOR DEVICE WITH STRAINED LAYER

This application is a continuation application of and claims the benefit of U.S. application Ser. No. 14/097,058, filed Dec. 4, 2013, entitled "Semiconductor Device With Strained Layer," which application is incorporated herein in its entirety by reference.

BACKGROUND

The semiconductor integrated circuit (IC) industry has experienced rapid growth. Over the course of this growth, functional density of the devices has generally increased while the device feature size or geometry has decreased. This scaling down process generally provides benefits by increasing production efficiency, lowering costs, and/or improving performance. Such scaling down has also increased the complexities of processing and manufacturing ICs and, for these advances to be realized similar developments in IC fabrication are needed.

Likewise, the demand for increased performance and shrinking geometry from ICs has brought the introduction of multi-gate devices. These multi-gate devices include multi-gate fin-type transistors, also referred to as FinFET devices, because the channel is formed on a "fin" that extends from the substrate. FinFET devices may allow for shrinking the gate width of device while providing a gate on the sides and/or top of the fin including the channel region.

Another manner for improving the performance of a semiconductor device is to provide stress on or strain to pertinent regions of the device. Manipulating the stress provided in a region is an effective way of improving the minority carrier mobility in a FET device. When stress is applied to a channel of a semiconductor device, the mobilities of the carriers can be affected and as such the transconductance and on-current for the device altered. For example, tensile stress may benefit an NFET device allowing increased mobility of the carriers (e.g., holes) through the channel region. Conversely, compressive stress may benefit a PFET device.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
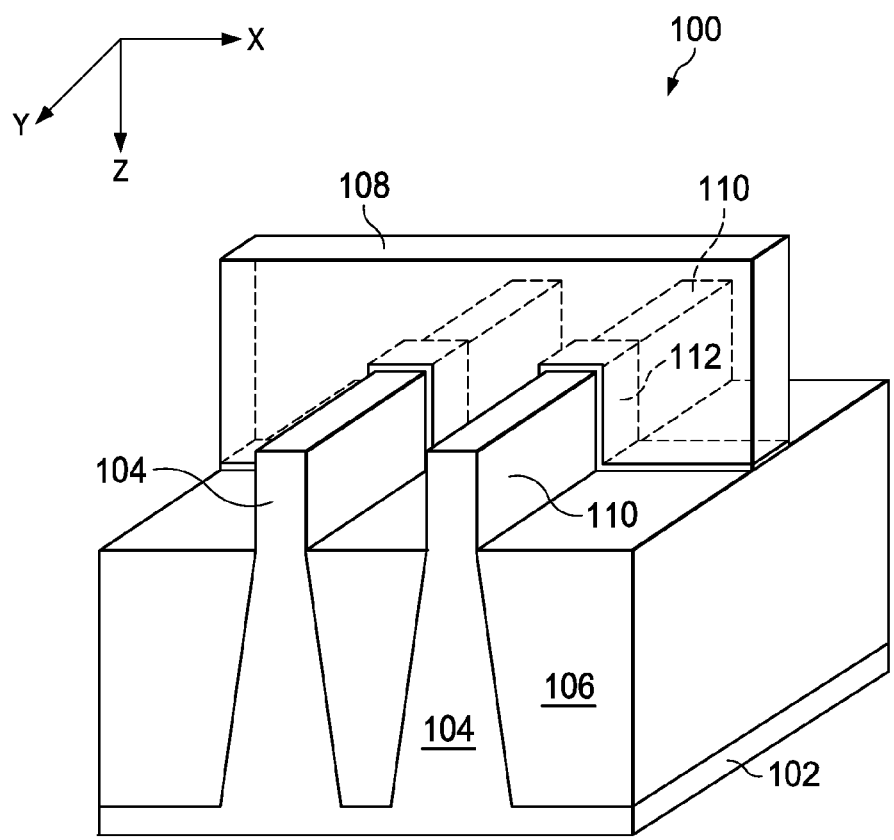
FIG. 1 illustrates a perspective view of an embodiment of a semiconductor device according to one or more aspects of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Illustrated in FIG. 1 is a semiconductor device 100. The semiconductor device 100 includes FinFET type device(s). Semiconductor device 100 may be an n-type FinFET or a p-type FinFET. Semiconductor device 100 may be included in an IC such as a microprocessor, memory device, and/or other IC. Device 100 includes a substrate 102, a plurality of fins 104, a plurality of isolation structures 106, and a gate structure 108 disposed on each of fins 104. Each of fins 104 includes a source/drain region denoted 110 where a source or drain feature is formed in, on, and/or surrounding fin 104. A channel region of fin 104 underlies gate structure 108 and is denoted as 112.

Substrate 102 may be a silicon substrate. Alternatively, substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, substrate 102 is a semiconductor on insulator (SOI) substrate.

Isolation structures 106 may be formed of silicon oxide, silicon nitride, silicon oxynitride, fluoride-doped silicate glass (FSG), a low-k dielectric material, and/or other suitable insulating material. Isolation structures 106 may be shallow trench isolation (STI) features. In an embodiment, isolation structures 106 are STI features and are formed by etching trenches in substrate 102. The trenches may then be filled with isolating material, followed by a chemical mechanical polish (CMP). Other fabrication techniques for isolation structures 106 and/or fin structures 104 are possible. Isolation structures 106 may include a multi-layer structure, for example, having one or more liner layers.

Fin structures 104 may provide an active region where one or more devices are formed. In an embodiment, a channel of a transistor device is formed in fins 104. Fins 104 may comprise silicon or another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Fins 104 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. The masking element may then be used to protect regions of the substrate while an etch process forms a recesses into the silicon layer, leaving an extending fin. The recesses may be etched using reactive ion etch (RIE) and/or other suitable processes. Numerous other embodiments of methods to form fins 104 on substrate 102 may be suitable.

In an embodiment, fins 104 are approximately 10 nanometer (nm) wide and between approximately 15 nm and 40 nm high (as measured from height of fins 104 above isolation region 106). However, it should be understood that other dimensions may be used for fins 104. Fin 104 may be doped using n-type and/or p-type dopants.

Gate structure 108 may include a gate dielectric layer, a work function layer, and/or one or more additional layers. In an embodiment, gate structure 108 includes a silicide layer such as described in the embodiments below. The silicide layer may overlie the gate dielectric layer and/or the work function layer.

In an embodiment, semiconductor device 100 is provided during fabrication and gate structure 108 is a sacrificial gate structure such as formed in a replacement gate process used to form a metal gate structure. In an embodiment, gate structure 108 includes polysilicon. In another embodiment, gate structure 108 includes a metal gate structure.

A gate dielectric layer of gate structure 108 may include silicon dioxide. The silicon oxide may be formed by suitable oxidation and/or deposition methods. Alternatively, the gate dielectric layer of gate structure 108 may include a high-k dielectric layer such as hafnium oxide (HfO2). Alternatively, the high-k dielectric layer may optionally include other high-k dielectrics, such as TiO2, HfZrO, Ta2O3, HfSiO4, ZrO2, ZrSiO2, combinations thereof, or other suitable material. The high-k dielectric layer may be formed by atomic layer deposition (ALD) and/or other suitable methods.

In an embodiment, gate structure 108 may be a metal gate structure. The metal gate structure may include interfacial layer(s), gate dielectric layer(s), work function layer(s), silicide layers as described below, fill metal layer(s), and/or other suitable materials for a metal gate structure. In other embodiments, metal gate structure 108 may further include capping layers, etch stop layers, and/or other suitable materials. The interfacial layer may include a dielectric material such as silicon oxide layer (SiO2) or silicon oxynitride (SiON). The interfacial dielectric layer may be formed by chemical oxidation, thermal oxidation, atomic layer deposition (ALD), CVD, and/or other suitable dielectric.

Exemplary p-type work function metals that may be included in the gate structure 108 include TiN, TaN, Ru, Mo, Al, WN, ZrSi2, MoSi2, TaSi2, NiSi2, other suitable p-type work function materials, or combinations thereof. Exemplary n-type work function metals that may be included in gate structure 108 include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the first work function layer is chosen to tune its work function value so that a desired threshold voltage Vt is achieved in the device that is to be formed in the respective region. The work function layer(s) may be deposited by CVD, PVD, and/or other suitable process. The fill metal layer may include Al, W, or Cu and/or other suitable materials. The fill metal may be formed by CVD, PVD, plating, and/or other suitable processes. The fill metal may be deposited over the work function metal layer(s), and thereby filling in the remaining portion of the trenches or openings formed by the removal of the dummy gate structure. The silicide layer may interpose the work function layer and the fill metal.

Semiconductor device 100 may include other layers and/or features not specifically illustrated including additional source/drain regions, interlayer dielectric (ILD) layers, contacts, interconnects, and/or other suitable features.

Semiconductor device 100 may benefit in performance from a stress provided on fins 104 in channel region 112. In an embodiment, a tensile strain may be generated. In another embodiment, a compressive strain may be generated. The strain may be obtained using a method 200, described below with reference to FIG. 2. In an embodiment of the present disclosure, the stress is provided to gates through forming a strained layer over gate structure.

Figure 2:
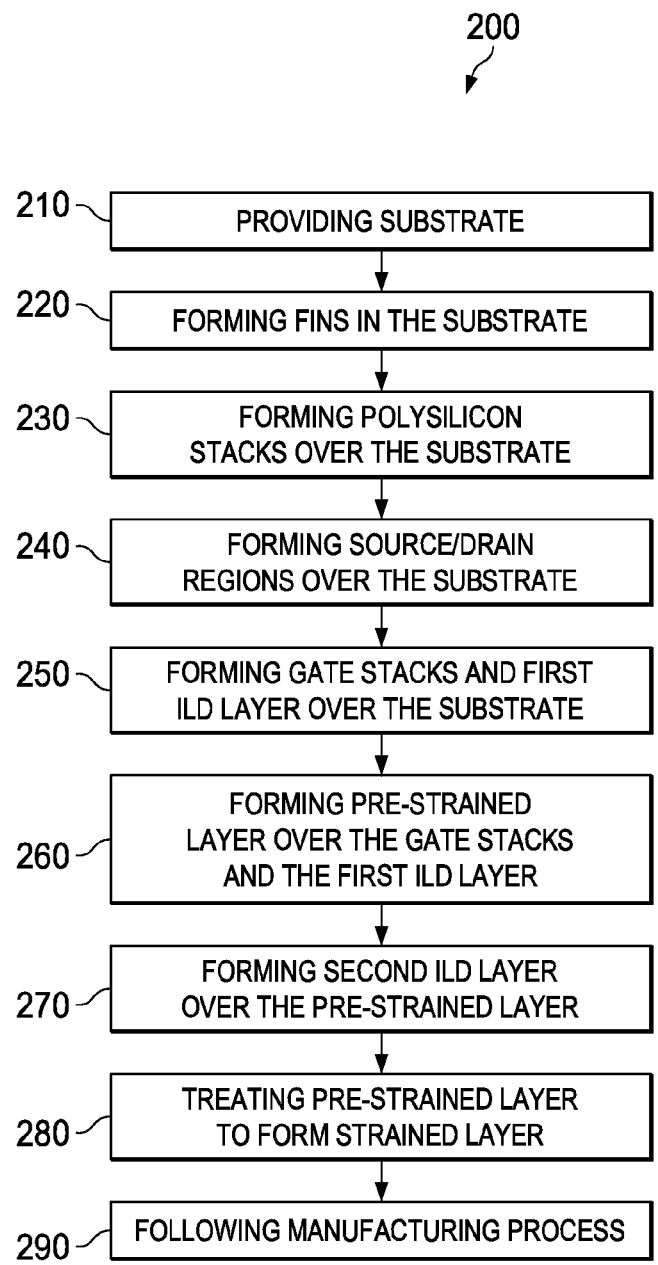
FIG. 2 illustrates a flowchart illustrating a method for fabricating a FinFET according to various aspects of the present disclosure.

Referring to FIG. 2, illustrated is a flowchart of method 200 for of fabricating a fin field effect transistor (FinFET) according to embodiments of the present disclosure. Method 200 begins with a step 210 in which a substrate is provided. Method 200 continues with a step 220 in which fins are formed in the substrate. Method 200 continues with a step 230 in which polysilicon stacks are deposited over the substrate. Method 200 continues with a step 240 in which source/drain regions are formed over the substrate. Method 200 continues with a step 250 in which gate stacks and a first inter-layer dielectric (ILD) layer are formed over the substrate. Method 200 continues with a step 260 in which a pre-strained layer is deposited over the gate stacks and the first ILD layer on the substrate. Method 200 continues with a step 270 in which a second ILD layer is deposited over the pre-strained layer. Method 200 continues with a step 280 in which the pre-strained layer is treated to form a strained layer. Method 200 continues with a step 290 in which following manufacturing processes are performed.

As employed in the present disclosure, a FinFET refers to any fin-based, multi-gate transistor. In various embodiments of the present disclosure, the present disclosure, a FinFET may be included in a microprocessor, memory cell, and/or other integrated circuit (IC). It is noted that the method of FIG. 2 does not produce a completed FinFET. In various embodiments of the present disclosure, a completed FinFET may be fabricated using complementary metal-oxide-semiconductor (CMOS) technology processing. Accordingly, it is understood that additional processes may be provided before, during, and after method 200 of FIG. 2, and that some other processes may only be briefly described herein. In addition, FIGS. 1 through 9 are simplified for a better understanding of the inventive concepts of the present disclosure. For example, although the figures illustrate a FinFET, it is understood the IC may comprise a number of other devices comprising resistors, capacitors, inductors, fuses, etc.

Referring to FIGS. 3-9, illustrated are various views of a FinFET structure at various stages of fabrication according to embodiments of the present disclosure.

Figure 3A:
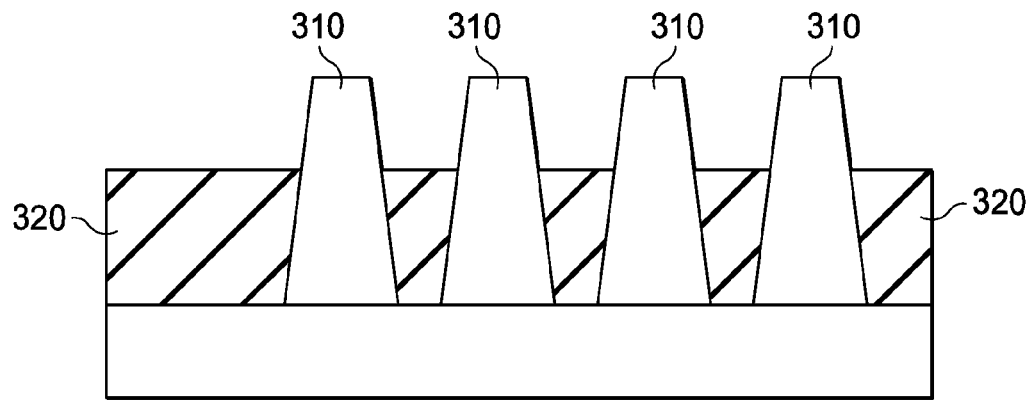
FIGS. 3A-9 illustrate various perspective and cross-sectional views of a FinFET at various stages of fabrication according to embodiments of the present disclosure.
Figure 3B:
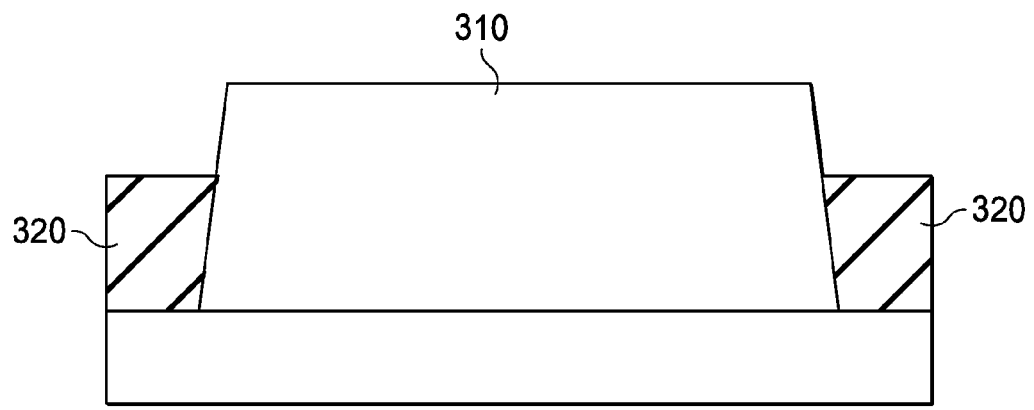

FIGS. 3A and 3B illustrate two views of a FinFET structure having a substrate at one of various stages of fabrication according to embodiments of the present disclosure. Referring back to FIG. 2, method 200 of various embodiments of the present disclosure begins with step 210 in which a substrate (not shown in FIGS. 3A and 3B) is provided. In some embodiments of the present disclosure, the substrate herein may be substrate 102 of FIG. 1.

Referring back to FIG. 2, method 200 of embodiments of the present disclosure continues with step 220 in which fins 310 are formed, as shown in FIGS. 3A and 3B. In an embodiment of the present disclosure, fins 310 are formed by etching into the substrate. It should be noted that FIGS. 3A and 3B are two cross-sectional views of a FinFET structure of various embodiments of the present disclosure. FIG. 3A illustrates a cross-sectional view of the FinFET structure taken along a first direction and FIG. 3B illustrates another cross-sectional view of the FinFET structure taken in a second direction perpendicular to the first direction. In embodiments of the present disclosure, FIG. 3A shows a cross-sectional view taken in an X-direction of semiconductor device 100 shown in FIG. 1 and FIG. 3B shows another cross-section view taken in a Y-direction of semiconductor device 100 shown in FIG. 1. Accordingly, the first direction illustrated in FIG. 3A is in parallel with the direction of the width of fins 310 and the second direction illustrated in FIG. 3B is in parallel with the direction of the length of fins 310.

It should be noted that the number of fins 310 is not limited by the semiconductor structure shown in FIGS. 3A and 3B and can include more or less than that depicted in FIGS. 3A and 3B. In embodiments of the present disclosure, fins 310 may be simultaneously formed, such that each fin 310 may comprise the same materials or layers.

In embodiments of the present disclosure, a shallow trench isolation (STI) layer 320 is formed over the substrate such that spaces among fins 310 are filled with STI layer 320, as shown in FIGS. 3A and 3B. In embodiments of the present disclosure, STI layer 320 herein may correspond to isolation layer 106 of FIG. 1. In embodiments of the present disclosure, STI layer 320 may comprise silicon oxide, silicon nitride, silicon oxynitride, other suitable materials, or combinations thereof. STI layer 320 may be formed by any suitable process. In embodiments of the present disclosure, forming STI layer 320 may include filling trenches (for example, by using a chemical vapor deposition process) with one or more dielectric materials. In embodiments of the present disclosure, STI layer 320 may have a multi-layer structure such as a thermal oxide liner layer filled with silicon nitride or silicon oxide.

Figure 4A:
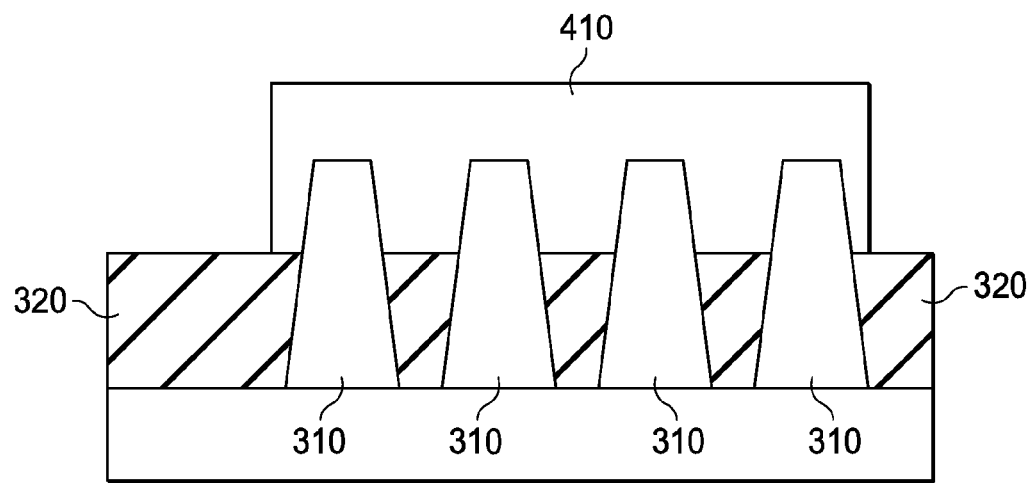
Figure 4B:
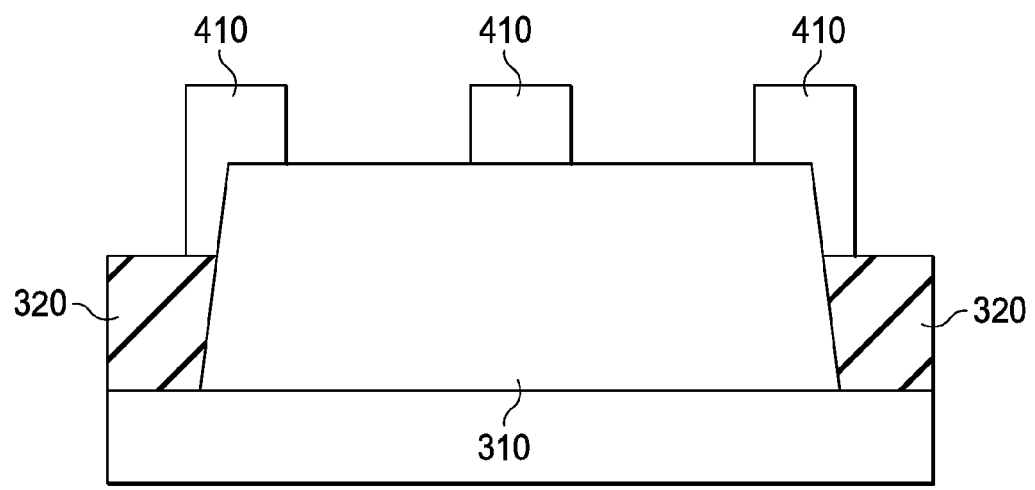

FIGS. 4A and 4B illustrate two views of a FinFET structure having a substrate at one of various stages of fabrication according to embodiments of the present disclosure. It should be noted that FIGS. 4A and 4B are two cross-sectional views of FinFET structure of various embodiments of the present disclosure. FIG. 4A illustrates a cross-sectional view of the FinFET structure taken along a first direction and FIG. 4B illustrates another cross-sectional view of the FinFET structure taken in a second direction perpendicular to the first direction. In an embodiment of the present disclosure, FIG. 4A shows a cross-sectional view taken in an X-direction of semiconductor device 100 shown in FIG. 1 and FIG. 4B shows another cross-section view taken in a Y-direction of semiconductor device 100 shown in FIG. 1. Accordingly, the first direction illustrated in FIG. 4A is in parallel with the direction of the width of fins 310 and the second direction illustrated in FIG. 4B is in parallel with the direction of the length of fins 310.

Referring back to FIG. 2, method 200 of embodiments of the present disclosure continues with step 230 in which polysilicon stacks 410 are deposited over fins 310 and STI layer 320, as shown in FIGS. 4A and 4B.

Referring to FIGS. 4A and 4B, polysilicon stacks 410 are deposited such that the direction of the length of each polysilicon stack 410 is in parallel with the direction of the width of each fin 310, as shown in FIG. 4A and the direction of the width of each polysilicon stack 410 is in parallel with the direction of the length of each fin 310, as shown in FIG. 4B, in embodiments of the present disclosure.

It should be noted that the number of polysilicon stacks 410 is not limited by the semiconductor structure shown in FIGS. 3A and 3B and can include more or less than that depicted in FIGS. 3A and 3B. In embodiments of the present disclosure, polysilicon stacks 410 may be simultaneously formed, such that each polysilicon stack 410 may comprise the same materials or layers.

Figure 5A:
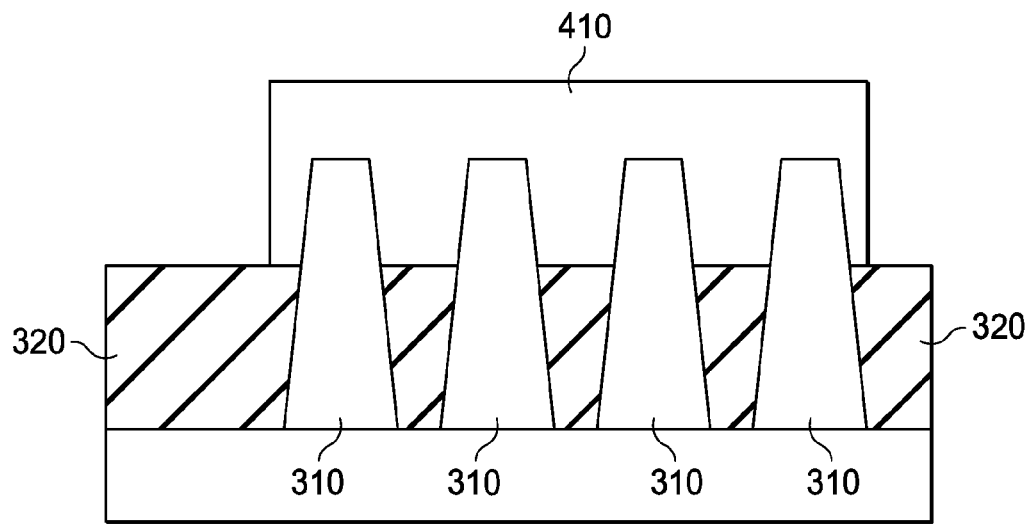
Figure 5B:
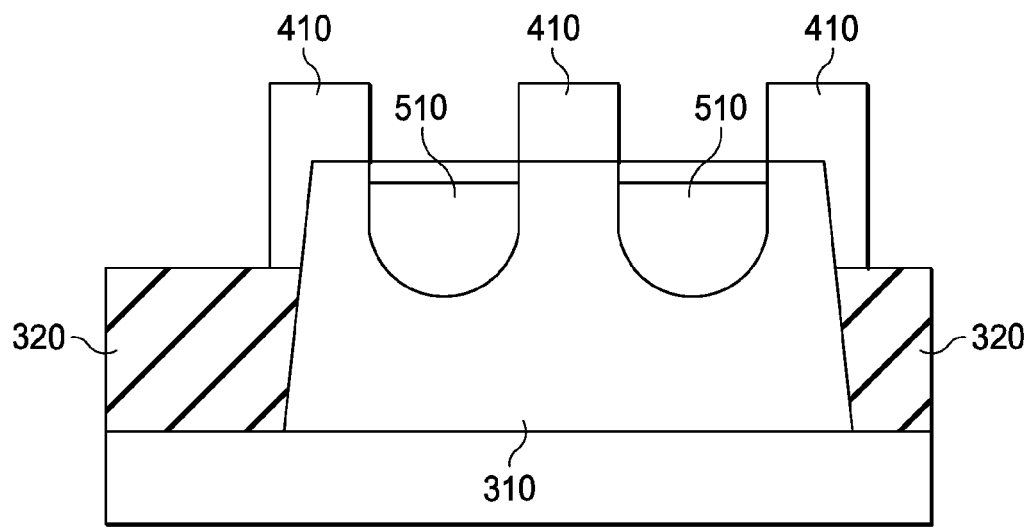

FIGS. 5A and 5B illustrate two views of a FinFET structure having a substrate at one of various stages of fabrication according to embodiments of the present disclosure. It should be noted that FIGS. 5A and 5B are two cross-sectional views of FinFET structure of embodiments of the present disclosure. FIG. 5A illustrates a cross-sectional view of the FinFET structure taken along a first direction and FIG. 5B illustrates another cross-sectional view of the FinFET structure taken in a second direction perpendicular to the first direction. In embodiments of the present disclosure, FIG. 5A shows a cross-sectional view taken in an X-direction of semiconductor device 100 shown in FIG. 1 and FIG. 5B shows another cross-section view taken in a Y-direction of semiconductor device 100 shown in FIG. 1. Accordingly, the first direction illustrated in FIG. 5A is in parallel with the direction of the width of fins 310 and the second direction illustrated in FIG. 5B is in parallel with the direction of the length of fins 310.

Referring back to FIG. 2, method 200 of embodiments of the present disclosure continues with step 240 in which source/drain regions are formed in fins 310, as shown in FIGS. 5A and 5B.

Referring to FIGS. 5A and 5B, source/drain regions 510 are formed on opposite sides of at least one polysilicon stacks 410 according to embodiments of the present disclosure. In embodiments of the present disclosure, source/drain regions 510 may be epitaxy regions formed within fins 310. In embodiments of the present disclosure, source/drain regions 510 may be silicon epitaxy regions. In embodiments of the present disclosure, source/drain regions 510 may be silicon germanium epitaxy regions. However, numerous other embodiments of epitaxially grown materials are possible such as, silicon, silicon germanium, silicon carbide, germanium, gallium arsenide, indium phosphide, and/or other suitable materials.

In embodiments of the present disclosure, a spacer layer (not shown) may be deposited over sidewalls of polysilicon stacks 410 to define source/drain regions 510 on fins 310. After spacer layer is deposited, an epitaxy (epi) process is performed to form source/drain regions 510 within fins 310.

In embodiments of the present disclosure, step 240 can be implemented by performing an etching process to form recess regions in fins 310 and then performing an epitaxy (epi) process to deposit a semiconductor material in the recess regions. The etching process includes a dry etching process that utilizes a combination of HBr/Cl2/O2/He, a pressure ranging from about 1 mT to about 1000 mT, a power ranging from about 50 W to about 1000 W, a bias voltage ranging from about 100 V to about 500 V, an HBr flow rate ranging from about 10 sccm to about 500 sccm, a Cl2 flow rate ranging from about 0 sccm to about 500 sccm, an O2 flow rate ranging from about 0 sccm to about 100 sccm, and an He flow rate ranging from about 0 sccm to about 1000 sccm. The dry etching removes portions of fins 310 that are unprotected or exposed. Accordingly, the recess regions include vertical sidewalls that are aligned with the polysilicon stack 410 due to the directional/anisotropic etching. The recess regions may have a depth ranging from about 400 to about 800 Angstrom (Å). When performing an epitaxy (epi) process to deposit a semiconductor material in the recess regions, a pre-cleaning process may be performed to clean the recess regions with HF or other suitable solution. The semiconductor material is deposited over in the S/D region by a suitable process, such as an epitaxy or epitaxial (epi) process. The epitaxy process may include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition (e.g., silicon) of the substrate. The semiconductor material may include Si, SiP, SiC, SiCP, a combination thereof, or any other suitable semiconductor material.

Figure 6A:
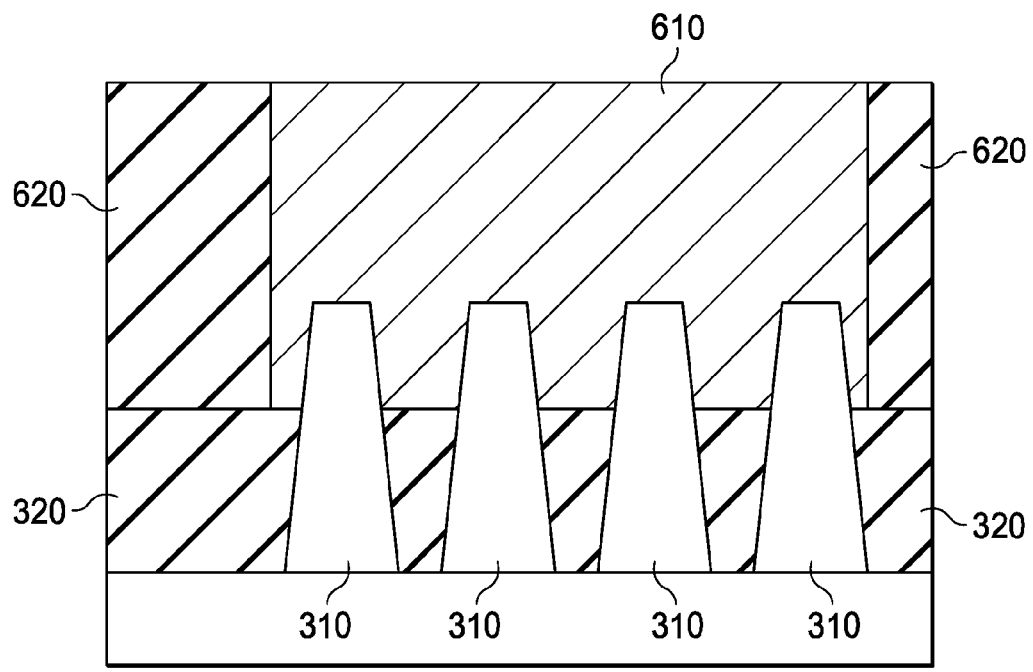
Figure 6B:
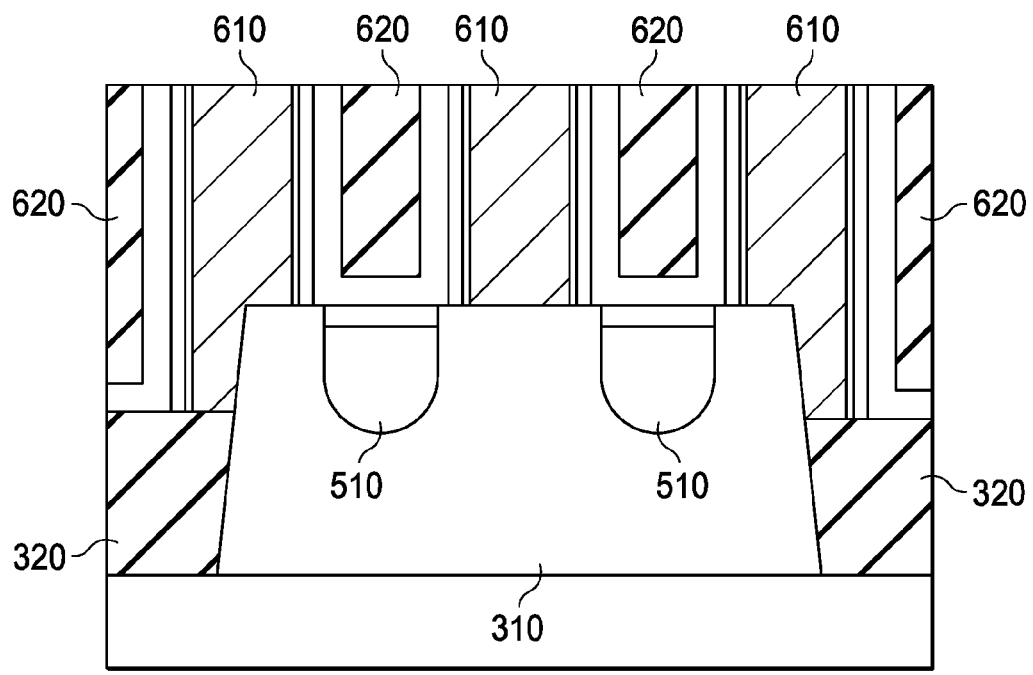

FIGS. 6A and 6B illustrate two views of a FinFET structure having a substrate at one of various stages of fabrication according to embodiments of the present disclosure. It should be noted that FIGS. 6A and 6B are two cross-sectional views of FinFET structure of embodiments of the present disclosure. FIG. 6A illustrates a cross-sectional view of the FinFET structure taken along a first direction and FIG. 6B illustrates another cross-sectional view of the FinFET structure taken in a second direction perpendicular to the first direction. In embodiments of the present disclosure, FIG. 6A shows a cross-sectional view taken in an X-direction of semiconductor device 100 shown in FIG. 1 and FIG. 6B shows another cross-section view taken in a Y-direction of semiconductor device 100 shown in FIG. 1. Accordingly, the first direction illustrated in FIG. 6A is in parallel with the direction of the width of fins 310 and the second direction illustrated in FIG. 6B is in parallel with the direction of the length of fins 310.

Referring back to FIG. 2, method 200 of embodiments of the present disclosure continues with step 250 in which gate stacks 610 and first inter-layer dielectric (ILD) layer 620 are deposited over fins 310 and STI layer 320, as shown in FIGS. 6A and 6B.

It should be noted that in embodiments of the present disclosure disclosed above, a gate-last process may be performed such that polysilicon stacks 410 in FIGS. 4A and 4B may be replacement polysilicon gates (RPG). During the gate-last process disclosed as embodiments of the present disclosure, polysilicon stacks 410 may be replaced by metal gate stacks 610 in FIGS. 6A and 6B and the replacement is implemented after source/drain regions 510 are formed (step 240). In embodiments of the present disclosure, step 250 may be implemented by depositing first ILD layer 620 over the substrate to fill spaces among polysilicon stacks 410; then, polishing first ILD layer 620 such that a top surface of each polysilicon stacks 410 is uncovered by first ILD layer 620; then, removing polysilicon stacks 410 to form trenches for forming gate stacks; then, depositing gate dielectric material on sidewalls of the trenches; then, depositing gate electrode layer over the gate electric materials; and then, polishing first ILD layer 620, the gate dielectric material and the gate electrode layer to form gate stacks 610.

In some embodiments, first ILD layer 620 comprises a dielectric material, such as silicon oxide, silicon nitride, silicon oxynitride, TEOS formed oxide, phosphosilicate glass (PSG), borophosphosilicate glass (BPSG), low-k dielectric material, other suitable dielectric material, and/or combinations thereof. Exemplary low-k dielectric materials include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other proper materials, and/or combinations thereof. First ILD layer 620 may include a multilayer structure having multiple dielectric materials.

In some embodiments, gate dielectric material may include silicon oxide, silicon nitride, silicon oxy-nitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and/or mixtures thereof. In some embodiments of the present disclosure, the gate dielectric material may be a high-k dielectric layer with a thickness in the range of about 10 to 30 angstroms. In embodiments of the present disclosure, the gate dielectric material may be formed using a suitable process such as atomic layer deposition (ALD), chemical vapor deposition (CVD), physical vapor deposition (PVD), thermal oxidation, UV-Ozone Oxidation, or combinations thereof. The gate dielectric material may further comprise an interfacial layer (not shown) to reduce damage between the gate dielectric material and upper portion of fins 310 (i.e., channel region of the FinFET). The interfacial layer may comprise silicon oxide.

In embodiments of the present disclosure, the gate electrode layer covering the upper portion of fins 310 is deposited to form separate FinFETs. In embodiments of the present disclosure, the gate electrode layer covers the upper portion of more than one fins 310, as shown in FIG. 6A, so that the resulting FinFET comprises more than one fin 310.

In embodiments of the present disclosure, the gate electrode layer may comprise a single-layer or multilayer structure. In embodiments, the gate electrode layer comprises poly-silicon. Further, the gate electrode layer may be doped poly-silicon with the uniform or non-uniform doping. In other embodiments, the gate electrode layer comprises a metal selected from a group of W, Cu, Ti, Ag, Al, TiAl, TiAlN, TaC, TaCN, TaSiN, Mn, and Zr. In other embodiments, the gate electrode layer comprises a metal selected from a group of TiN, WN, TaN, and Ru. In still other embodiments, the gate electrode layer comprises a thickness in the range of about 30 nm to about 60 nm. The gate electrode layer may be formed by a suitable process such as ALD, CVD, PVD, plating, or combinations thereof.

The process steps up to this point have provided the substrate having the gate dielectric material covering the sidewalls of the trenches for forming gate stacks 610, and a gate electrode layer formed over the gate dielectric material. In embodiments of the present disclosure, a layer of photoresist is formed over the gate electrode layer by a suitable process, such as spin-on coating, and patterned to form a patterned photoresist feature over the gate electrode layer by a proper lithography patterning method. The patterned photoresist feature may be then transferred using a dry etching process to the underlying layers (i.e., the gate dielectric material and the gate electrode layer) to form gate stacks 610 along longitudinal direction of fins 310. The patterned gate electrode layer is referred to a conductive gate strip. The conductive gate strip thus wraps the channel portion of the exposed upper portion of fins 310.

It should be noted that in embodiments of the present disclosure, a gate-first process may be performed such that gate stacks 610 are deposited before first ILD layer 620 is deposited.

Figure 7A:
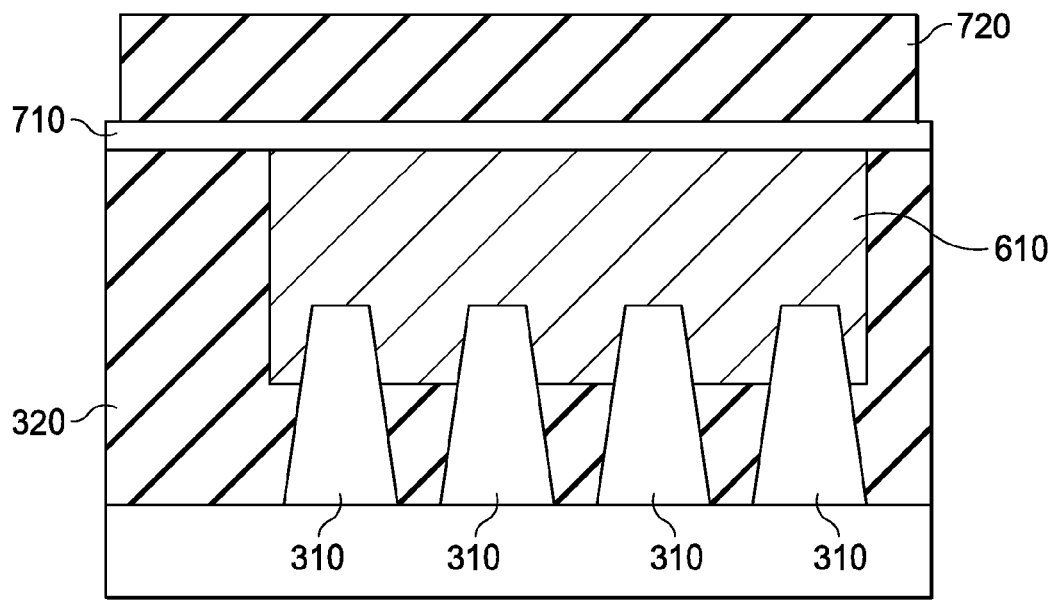
Figure 7B:
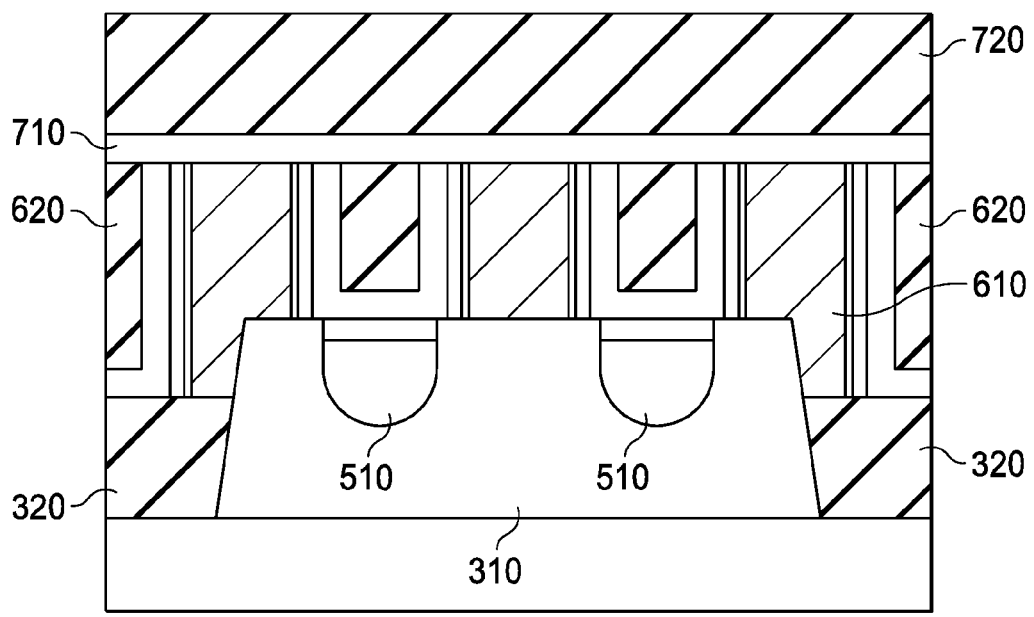

Referring back to FIG. 2, method 200 of embodiments of the present disclosure continues with step 260 in which a pre-strained layer 710 is deposited over gate stacks 610 and first ILD layer 620, as shown in FIGS. 7A and 7B.

FIGS. 7A and 7B illustrate two views of a FinFET structure having a substrate at one of various stages of fabrication according to embodiments of the present disclosure. It should be noted that FIGS. 7A and 7B are two cross-sectional views of FinFET structure of embodiments of the present disclosure. FIG. 7A illustrates a cross-sectional view of the FinFET structure taken along a first direction and FIG. 7B illustrates another cross-sectional view of the FinFET structure taken in a second direction perpendicular to the first direction. In embodiments of the present disclosure, FIG. 7A shows a cross-sectional view taken in an X-direction of semiconductor device 100 shown in FIG. 1 and FIG. 7B shows another cross-section view taken in a Y-direction of semiconductor device 100 shown in FIG. 1. Accordingly, the first direction illustrated in FIG. 7A is in parallel with the direction of the width of fins 310 and the second direction illustrated in FIG. 7B is in parallel with the direction of the length of fins 310.

Referring to FIGS. 7A and 7B, in embodiments of the present disclosure, pre-strained layer 710 may be a silicon layer deposited by PECVD. In embodiments of the present disclosure, pre-strained layer 710 may be a germanium layer deposited by RPCVD. In embodiments of the present disclosure, the thickness of pre-strained layer 710 may be in the range between 30 angstrom and 50 angstrom.

Referring back to FIG. 2, method 200 of embodiments of the present disclosure continues with step 270 in which a second ILD layer 720 is deposited over pre-strained layer 710, as shown in FIGS. 7A and 7B.

In embodiments of the present disclosure, second ILD layer 720 comprises a dielectric material, such as silicon oxide, silicon nitride, silicon oxynitride, TEOS formed oxide, phosphosilicate glass (PSG), borophosphosilicate glass (BPSG), low-k dielectric material, other suitable dielectric material, and/or combinations thereof. Exemplary low-k dielectric materials include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other proper materials, and/or combinations thereof. In embodiments of the present disclosure, second ILD layer 720 may include a multilayer structure having multiple dielectric materials.

Figure 8A:
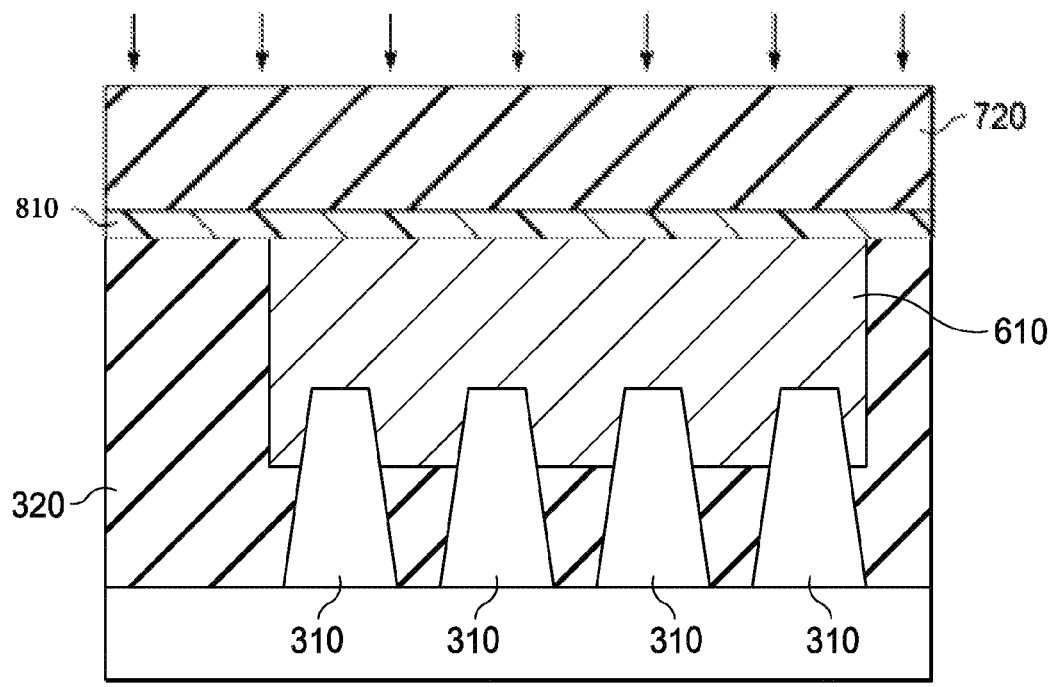
Figure 8B:
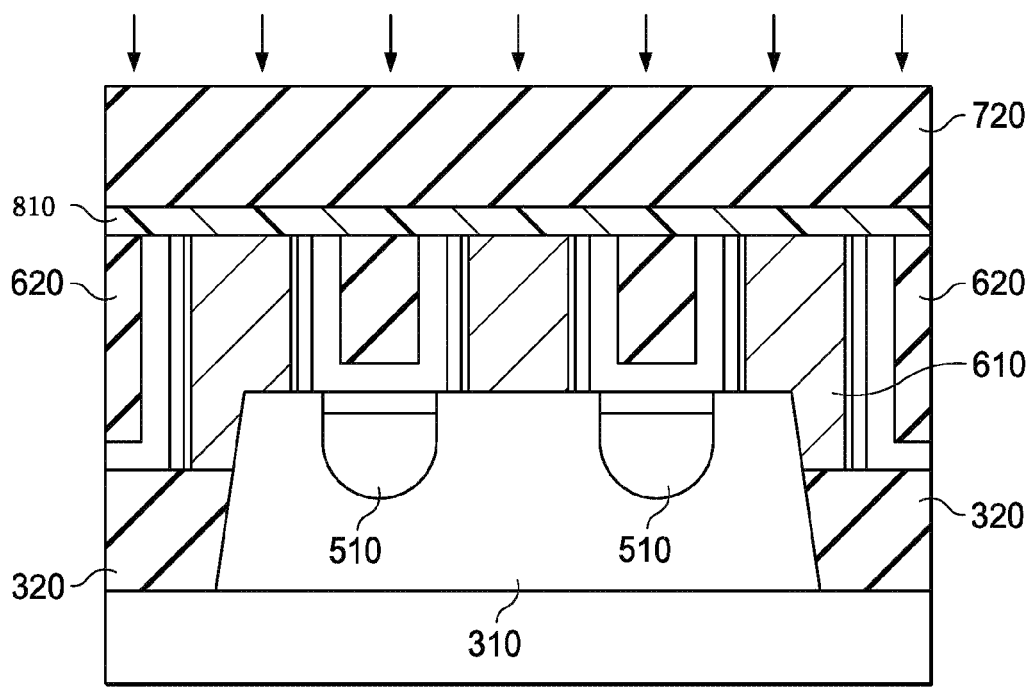

Referring back to FIG. 2, method 200 of embodiments of the present disclosure continues with step 280 in which pre-strained layer 710 is treated to form a strained layer 810, as shown in FIGS. 8A and 8B.

Figure 9:
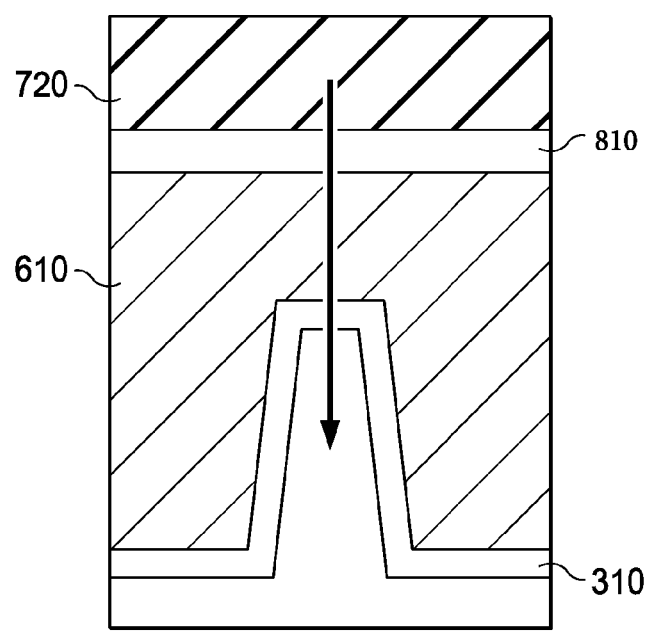

Referring to FIGS. 8A and 8B, in embodiments of the present disclosure, hydrogen peroxide ($H_2O_2$) may be provided by PECVD over second ILD layer 720 such that pre-strained layer 710 composed of silicon, germanium, or a combination of both may be oxidized by hydrogen peroxide to from strained layer 810 composed by silicon oxide ($SiO_2$), germanium oxide ($GeO_2$), or a combination of both, respectively. Due to lattice mismatch between strained layer 810 and gate stacks 610, strained layer 810 provides mechanical forces in a third direction, as shown in FIG. 9, to enhance carrier mobility in channel region of FinFET. The third direction is perpendicular to the first direction in parallel with the direction of the width of fins 310 and the second direction in parallel with the direction of the length of fins 310, as shown in FIG. 9. The third direction may be in parallel with a Z-direction of semiconductor device 100 shown in FIG. 1. With strained forces provide by strained layer 810, the performance of FinFET disclosed in embodiments of the present disclosure may be enhanced. In embodiments of the present disclosure, strained layer 810 may be a compressive strained layer that provides compressive forces or a tensile strained layer that provides tensile strained forces.

Referring back to FIG. 2, method 200 of embodiments of the present disclosure continues with step 290 in which following manufacturing process are performed. In embodiments of the present disclosure, method 200 may continue to include further CMOS or MOS technology processing to form various features known in the art. Exemplary processes that may be performed include the formation of contact features coupled to the gate structure including fill metal layer, and a multi-layer interconnect (MLI) having via and interconnect lines that may interconnect one or more semiconductor devices formed on the substrate.

In an embodiment, a method of forming a semiconductor device is provided. The method includes forming a gate stack over a substrate, forming a first inter-layer dielectric (ILD) layer over the substrate, an upper surface of the gate stack being exposed after forming the first ILD layer, and forming a pre-strained layer over the upper surface of the gate stack and the first ILD layer, the pre-strained layer being a semiconductor layer. The method further includes forming a second ILD layer over the pre-strained layer, and after forming the second ILD layer, transforming the pre-strained layer into a strained layer.

In another embodiment, a method of forming a semiconductor device is provided. The method includes forming a gate stack over a substrate, the substrate having a fin, forming a first dielectric layer over the substrate, an upper surface of the gate stack being exposed after forming the first dielectric layer, and forming a semiconductor layer over the upper surface of the gate stack and the first dielectric layer. The method further includes forming a second dielectric layer over the semiconductor layer, and after forming the second dielectric layer, converting the semiconductor layer into an oxide layer.

In yet another embodiment, a method of forming a semiconductor device is provided. The method includes forming a gate stack over a substrate, forming a first inter-layer dielectric (ILD) layer over the substrate, an upper surface of the gate stack being exposed after forming the first ILD layer, and forming a first layer over the upper surface of the gate stack, the first layer having a first composition. The method further includes forming a second ILD layer over the first layer, and after forming the second ILD layer, performing a process, the process altering a composition of the first layer to a second composition, the first composition being different than the second composition.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of forming a semiconductor device, the method comprising:
    forming a gate stack over a substrate;
    forming a first inter-layer dielectric (ILD) layer over the substrate, an upper surface of the gate stack being exposed after forming the first ILD layer;
    forming a pre-strained layer over the upper surface of the gate stack and the first ILD layer, the pre-strained layer being a semiconductor layer;
    forming a second ILD layer over the pre-strained layer; and
    after forming the second ILD layer, transforming the pre-strained layer into a strained layer.

2. The method of claim 1, wherein forming the gate stack comprises:
forming a dummy gate stack;
forming the first inter-layer dielectric, the dummy gate stack being exposed;
removing the dummy gate stack, thereby forming a recess in the first inter-layer dielectric; and
forming the gate stack in the recess.

3. The method of claim 1, wherein the pre-strained layer includes silicon or germanium.

4. The method of claim 1, wherein the strained layer includes silicon oxide or germanium oxide.

5. The method of claim 1, wherein transforming the pre-strained layer into the strained layer comprises providing hydrogen peroxide over the second ILD layer.

6. The method of claim 5, wherein providing hydrogen peroxide comprises providing hydrogen peroxide by PECVD.

7. The method of claim 1, wherein the strained layer is configured to provide a strain force to the gate stack in a direction perpendicular to a top surface of the substrate.

8. A method of forming a semiconductor device, the method comprising:
forming a gate stack over a substrate, the substrate having a fin;
forming a first dielectric layer over the substrate, an upper surface of the gate stack being exposed after forming the first dielectric layer;
forming a semiconductor layer over the upper surface of the gate stack and the first dielectric layer;
forming a second dielectric layer over the semiconductor layer; and
after forming the second dielectric layer, converting the semiconductor layer into an oxide layer.

9. The method of claim 8, wherein the gate stack is formed after forming the first dielectric layer.

10. The method of claim 8, wherein an upper surface of the oxide layer is level.

11. The method of claim 8, wherein the converting is performed at least in part by exposing the second dielectric layer to hydrogen peroxide.

12. The method of claim 11, wherein the exposing is performed at least in part by PECVD.

13. The method of claim 8, wherein the oxide layer exerts a greater amount of stress on the gate stack than the semiconductor layer.

14. The method of claim 8, wherein a bottom surface of the semiconductor layer is level.

15. The method of claim 8, wherein the oxide layer is configured to provide a strain force to the gate stack in a direction perpendicular to a surface of the fin.

16. A method of forming a semiconductor device, the method comprising:
forming a gate stack over a substrate;
forming a first inter-layer dielectric (ILD) layer over the substrate;
thinning the first ILD layer, an upper surface of the gate stack being exposed after thinning the first ILD layer, the first ILD layer extending completely over source/drain regions adjacent the gate stack after thinning the first ILD layer;
after thinning the first ILD, forming a first layer over the upper surface of the gate stack, the first layer having a first material composition;
forming a second ILD layer over the first layer; and
after forming the second ILD layer, performing a process, the process altering a composition of the first layer to a second material composition, the first material composition being different than the second material composition.

17. The method of claim 16, wherein the first material composition comprises a semiconductor.

18. The method of claim 17, wherein the semiconductor comprises silicon or germanium.

19. The method of claim 18, wherein the second material composition comprises an oxide of silicon or germanium.

20. The method of claim 16, wherein the process comprises exposing the second ILD layer to hydrogen peroxide by PECVD.

* * * * *